United States Patent
Pöchmüller

(10) Patent No.: US 6,741,491 B2
(45) Date of Patent: May 25, 2004

(54) INTEGRATED DYNAMIC MEMORY, AND METHOD FOR OPERATING THE INTEGRATED DYNAMIC MEMORY

(75) Inventor: Peter Pöchmüller, Colchester, VT (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/217,907

(22) Filed: Aug. 13, 2002

(65) Prior Publication Data

US 2003/0031043 A1 Feb. 13, 2003

(30) Foreign Application Priority Data

Aug. 13, 2001 (DE) .......................................... 101 39 725

(51) Int. Cl.[7] ............................................. G11C 114/24

(52) U.S. Cl. ......................... 365/149; 365/205; 365/63

(58) Field of Search ................................ 365/149, 205, 365/203, 63; 327/55, 57, 67

(56) References Cited

U.S. PATENT DOCUMENTS

| | | | | |
|---|---|---|---|---|
| 5,274,598 A | | 12/1993 | Fujii et al. ................... | 365/205 |
| 5,668,766 A | * | 9/1997 | Bramnik ...................... | 365/207 |
| 5,675,529 A | * | 10/1997 | Poole .......................... | 365/63 |
| 6,021,062 A | | 2/2000 | Matsuki ....................... | 365/63 |

* cited by examiner

*Primary Examiner*—Gene Auduong
(74) *Attorney, Agent, or Firm*—Laurence A. Greenberg; Werner H. Stemer; Gregory L. Mayback

(57) ABSTRACT

An integrated dynamic memory has word lines and bit lines as well as at least one global bit line, which is disposed in the memory cell array in the same sense as the bit lines. A voltage amplifier is connected to one of the bit lines for amplification of a data signal to a first voltage level which is not sufficient for writing the data signal back to the selected memory cell, and for outputting the amplified data signal to the global bit line. The global bit line is connected to a read amplifier for amplification of the data signal to a second voltage level that, in contrast, is sufficient for writing back the data signal. The hierarchical amplification concept allows rapid and reliable amplification of data signals that are to be read out, even if the integration density of the memory cells is high.

14 Claims, 4 Drawing Sheets

INTEGRATED DYNAMIC MEMORY, AND METHOD FOR OPERATING THE INTEGRATED DYNAMIC MEMORY

BACKGROUND OF THE INVENTION

Field of the Invention

The present invention relates to an integrated dynamic memory having word lines for selection of memory cells, and bit lines for reading data signals from the memory cells which make contact with the bit lines. The invention also relates to a method for operating such an integrated dynamic memory.

Integrated dynamic memories such as so-called dynamic random access memories (DRAMs), store data information in memory cells having storage capacitors which are each connected via a selection transistor to one of a number of bit lines. Each of the selection transistors are connected to one of the word lines for selection of the memory cells.

One conventional implementation of a DRAM having so-called complementary bit lines provides for the corresponding bit line and the bit line which is complementary to it to be made to assume the same voltage level (for example 1 V) before reading from the memory cells. Depending on the stored charge value, the voltage level on the bit line is changed by reading from a memory cell via the selection transistor. In the situation where, for example, a positive charge (for example a voltage of 2 V) is stored in the memory cell, the voltage level of the connected bit line is raised (for example from 1 V to 1.1 V if the bit line capacitance is higher by a factor of 10 than the memory capacitance of the memory cell) by reading out via the appropriate selection transistor. The voltage difference between the connected bit line and the complementary bit line is now amplified by a read amplifier, for example to a value of 2 V on the bit line and 0 V on the complementary bit line. If the selection transistor is still open, the amplified voltage value of, for example, 2 V is written back to the memory cell once again. This is an important process, since the memory cells slowly lose their charge via so-called leakage currents.

The high packing densities which are normally used nowadays in integrated memories result in the dimensions of the storage capacitors of the memory cells, and hence also their memory capacitance, being relatively low (albeit typically 20 to 40 fF nowadays). In order to achieve a high packing density, a very large number of the memory cells are generally connected to a single bit line by their selection transistors. In consequence, the bit line has a relatively high capacitance (typically 100 to 200 fF). When the storage capacitor charge is read to the connected bit line, this therefore results in only a very small voltage change of, for example, 50 to 100 mV. The voltage change must be amplified by the read amplifier to a voltage level that is acceptable for reading out and which is, for example, 2 V.

The increasing integration density is making it ever more difficult to produce memory cells with the memory capacitance that is normal nowadays. Since the read amplifiers for the memory occupy a relatively large area, there is, on the other hand, an aim to connect as many memory cells as possible to a single bit line. The capacitance of the bit lines is thus comparably very high, for which reason the voltage changes of the respective bit line as a result of reading from a memory cell are only very small. This in turn results in comparatively slow and complex read amplifiers.

SUMMARY OF THE INVENTION

It is accordingly an object of the invention to provide an integrated dynamic memory, as well as a method for operating the integrated dynamic memory which overcome the above-mentioned disadvantages of the prior art devices and methods of this general type, which allows fast and reliable amplification of data signals to be read from the memory cells, even when the memory cell integration density is high.

With the foregoing and other objects in view there is provided, in accordance with the invention, an integrated dynamic memory. The memory contains bit lines, word lines, and a memory cell array having memory cells connected to the word lines for selecting the memory cells and to the bit lines for reading data signals from the memory cells. At least one global bit line runs through the memory cell array but does not make direct contact with the memory cells. A voltage amplifier is connected to one of the bit lines for amplification of a data signal of a respective memory cell, to be read from, to a first voltage level not sufficient for writing the data signal back to the respective memory cell read from. The voltage amplifier is further connected to the global bit line and outputs the data signal amplified to the first voltage level. A read amplifier is connected to the global bit line. The read amplifier amplifies the data signal from the respective memory cell read from to a second voltage level, the second voltage level being sufficient for writing the data signal back to the respective memory cell.

In addition to the bit lines, the integrated dynamic memory according to the invention has at least one global bit line, which is disposed in the memory cell array in the same sense as the bit lines, but does not make direct contact with the memory cells. It is provided, for example, instead of a complementary bit line. Furthermore, a voltage amplifier is provided, which is connected to one of the bit lines for amplification of a data signal from a memory cell, which is to be read from, to a first voltage level, although this is not sufficient for writing the data signal back to the memory cell. The voltage amplifier is furthermore connected to the global bit line in order to output the amplified data signal which is itself connected to a read amplifier for amplification of the data signal which is to be read out, to a second voltage level which, in contrast to the first voltage level, is sufficient for writing the data signal back to the memory cell.

The invention thus provides a hierarchical amplification concept, in which the voltage amplifier acts as a preamplifier. This may be based on a simple circuit principle and, in this case, occupies only a small area on the chip. This makes it possible to shorten the bit lines, and to connect fewer memory cells to the respective bit line. This in turn leads to better voltage signals on the bit line that is to be read out, due to a reduced bit line capacitance. The voltage amplifier, whose configuration may be simple, amplifies the voltage signal on the bit line that is to be read out, and passes this to the global bit line. However, the preamplified signal is not strong enough to write a complete voltage level back to the memory cell which is to be read from. Nonetheless, the preamplified signal is strong enough to cause a considerable voltage change on a long global bit line. This signal can now be amplified via a conventional read amplifier to a full voltage level, which is sufficient for writing back to the memory cell which is to be read from.

During operation of the integrated dynamic memory according to the invention, the bit line that is to be read out and the global bit line are made to assume the same voltage level at the start of a reading-out process. The memory cell that is to be read from is then read from, so that the connected bit line experiences a voltage change. The voltage amplifier is then activated, so that the global bit line assumes the first voltage level, and a preamplified data signal is produced. The read amplifier is then activated, so that the global bit line assumes the second voltage level and hence assumes a value that is suitable for writing back to the memory cell. In order to write the data signal back following the reading-out process, the selected bit line is made to assume the same voltage level as the global bit line, for example via the voltage amplifier. The voltage value is written back to the selected memory cell, which is still open from the previous reading-out process and is selected for writing back the data signal.

The hierarchical amplification concept according to the invention on the one hand requires numerous voltage amplifiers, which act as preamplifiers, in order to provide a memory. On the other hand, the voltage amplifiers may be configured such that they have a relatively small area, since they may be based on a comparatively simple circuit concept. However, the preamplification allows long global bit lines to be driven. Therefore, a comparatively large number of voltage preamplifiers may be connected to one global bit line, so that only a small-number of conventional read amplifiers, which occupy a large area, are now required.

The hierarchical amplification concept according to the invention results in that there is no need to provide complementary bit lines. The global bit line may thus be disposed instead of a complementary bit line, together with the normal bit lines, in the same metallization plane in the memory. This advantageously results in that there is no need for any production processes that are more complicated than those for conventional memories.

In accordance with an added feature of the invention, the voltage amplifier has a connection for an activation signal and a first switch with a controlled path connected between the global bit line and the connection for the activation signal. The first switch has a control connection coupled to one of the bit lines.

In accordance with an additional feature of the invention, the voltage amplifier has a second switch connected to one of the bit lines. The control connection of the first switch is coupled through the second switch to one of the bit lines. The voltage amplifier has a third switch connected to a further one of the bit lines, and the first switch is coupled through the third switch to the further one of the bit lines.

In accordance with another feature of the invention, the voltage amplifier has a fourth switch with a controlled path, and one of the bit lines and the global bit line are connected to each other through the controlled path of the fourth switch.

In accordance with a further feature of the invention, a number of the bit lines are each connected through the voltage amplifier to the global bit line, and the bit lines and the global bit line have different lengths.

In accordance with another added feature of the invention, a metallization plane is provided, and the bit lines and the global bit line are disposed in the metallization plane.

In accordance with another additional feature of the invention, the memory cells have a selection transistor and a memory capacitance. The memory capacitance is in each case connected through the selection transistor to a respective bit line. The selection transistor in each case has a control connection connected to a respective word line. The selection transistors have active areas and the bit lines are disposed such that the active areas of the selection transistors run in parallel with, but in an opposite direction to, the bit lines.

In accordance with a concomitant feature of the invention, the word lines and the active areas of the selection transistors in the memory cells are disposed in an orthogonal grid, and the bit lines run diagonally across the orthogonal grid in a first direction and in a second direction. Each of the bit lines makes contact with a respective memory cell at a point at which the respective bit line changes direction.

In accordance with an added mode of the invention, there is the step of setting the bit line to assume a same voltage level as the global bit line, and the memory cell that was read from is selected for writing back a data signal.

In accordance with a further mode of the invention, there is the step of writing back an inverted signal to the memory cell, and reading out the data signal written back once again in inverted form during a subsequent reading-out process.

Other features which are considered as characteristic for the invention are set forth in the appended claims.

Although the invention is illustrated and described herein as embodied in an integrated dynamic memory, as well as a method for operating the integrated dynamic memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
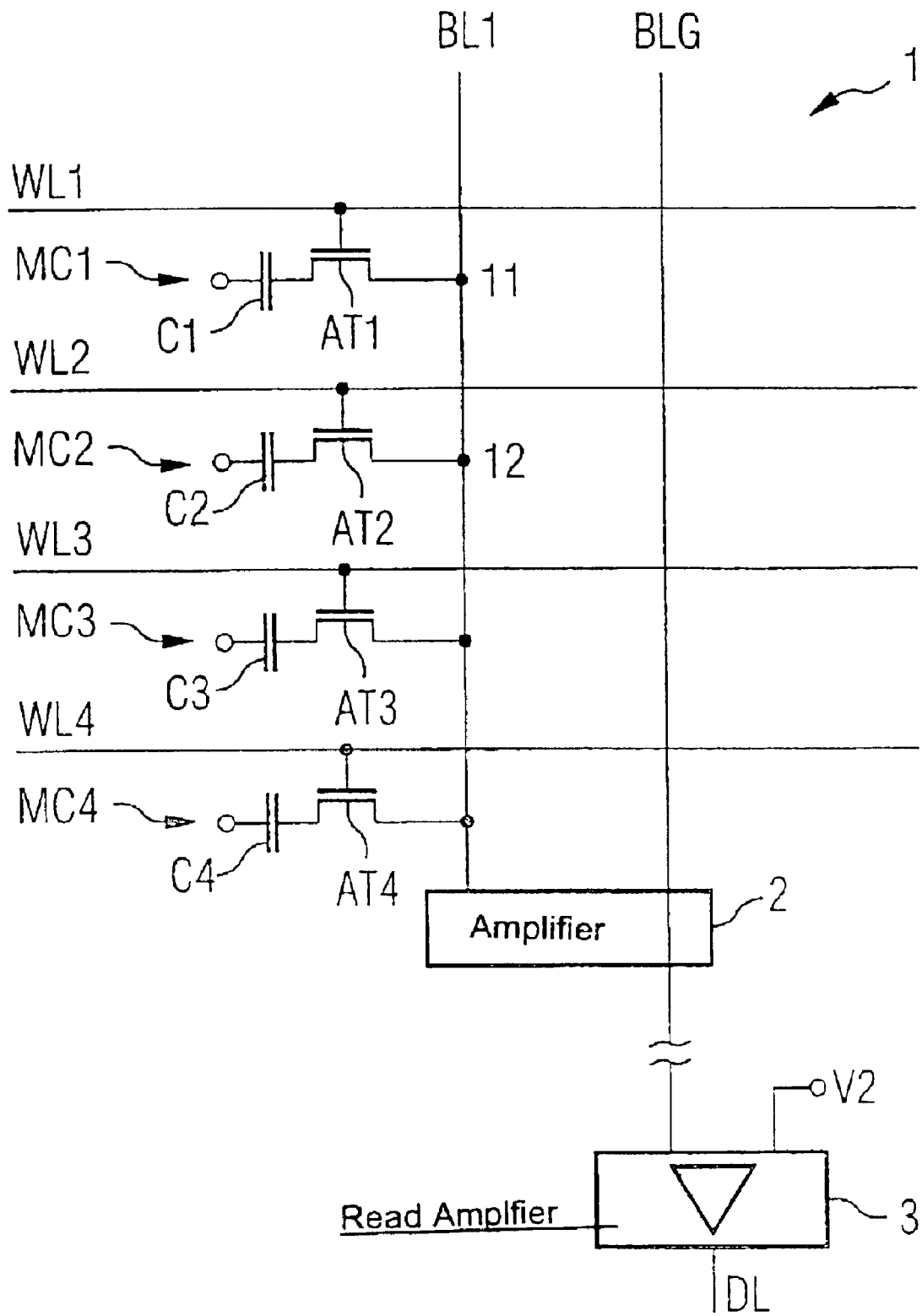
FIG. 1 is a circuit diagram of one embodiment of a dynamic memory according to the invention.

Referring now to the figures of the drawing in detail and first, particularly, to FIG. 1 thereof, there is shown one embodiment of a dynamic memory 1 which has word lines WL1 to WL4 and bit lines, although only one bit line BL1 is illustrated, in order to make the illustration clearer. A memory cell array of the memory 1 is in the form of a matrix, as is normal for dynamic random access memories (DRAMs), with memory cells MC1–MC4 being disposed at the crossing points of the word lines and bit lines. The memory cells MC1 to MC4 that make contact with the bit line BL1 each have a selection transistor AT1 to AT4, which is connected to a respective memory capacitance C1 to C4. Each of the memory capacitances C1–C4 is thus connected to the bit line BL1 via the selection transistor, and the control connection of each of the selection transistors is connected to one of the word lines WL1 to WL4.

A global bit line BLG is disposed in parallel with the bit line BL1, runs in the same sense as the bit line BL1 in the memory cell array 1 but, in contrast to the bit line BL1, does not make direct contact with the memory cells. A voltage amplifier 2 is thus connected both to the bit line BL1 and to the global bit line BLG. The global bit line BLG is furthermore connected to a read amplifier 3, which has a data output DL, as well as being connected to a supply voltage V2.

When a data signal is read from one of the memory cells MC1 to MC4, the data signal which is read from that memory cell is preamplified by the voltage amplifier 2 before being passed to the global bit line BLG. The data signal which is to be read out is in this case amplified to a first voltage level, although this is not sufficient for writing the data signal back to the memory cell which has been read from. However, the preamplified signal is strong enough to cause a considerable voltage change on the global bit line BLG, which is longer than the bit line BL1. The signal is amplified via the read amplifier 3 to a second voltage level, which can then be written back to the memory cell that has been read from the voltage amplifier 2.

Figure 2:
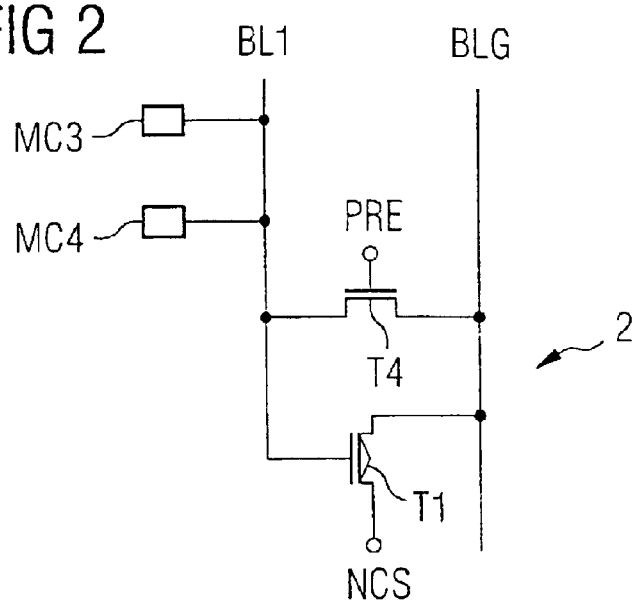
FIG. 2 is a circuit diagram of a first embodiment of a voltage amplifier.

FIG. 2 shows a simple embodiment of the voltage amplifier 2 as shown in FIG. 1. The voltage amplifier 2 has a switch in the form of a PMOS transistor T1, whose controlled path is connected between the global bit line BLG and a connection for an activation signal NCS. A control connection of the transistor T1 is connected to the bit line BL1. This is connected to the global bit line BLG via the controlled path through a further switch in the form of the transistor T4. The activation of the transistor T4 by a signal PRE results in the bit line BL1 and the global bit line BLG being made to assume the same voltage level. A memory cell, for example the memory cell MC4, is then read from, and this leads to a voltage change on the bit line BL1. The transistor T1 is activated by the activation signal NCS and, depending on the voltage level on the bit line BL1, can lead to an amplified signal on the global bit line BLG.

Figure 4:
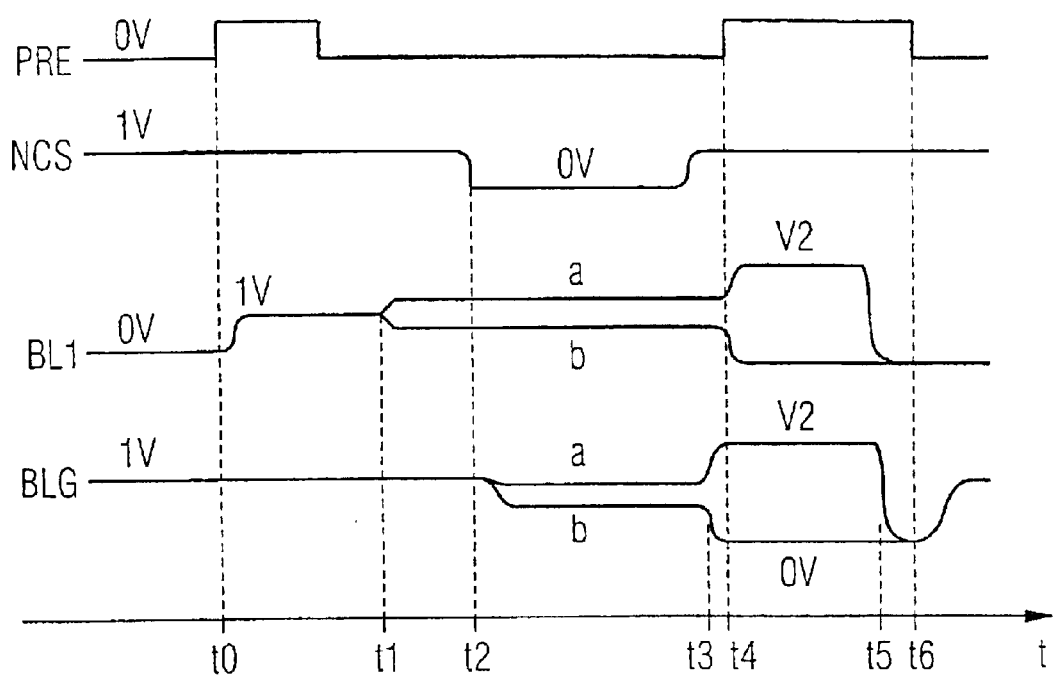
FIG. 4 is a timing diagram of signals for an example of a process of reading from the dynamic memory.

FIG. 4 shows a signal profile for the described reading-out process. The signal PRE is activated at the time t0. The bit line BL1 and the global bit line BLG assume a voltage level of, for example, 1 V. The memory cell MC4 is read from at the time t1, and this leads to a voltage change on the bit line BL1. The signal NCS is activated at the time t2. The transistor T1 is switched to conduct at a different level depending on the voltage level on the bit line BL1. In case b, the transistor T1 is switched to conduct at a higher level, so that the global bit line BLG assumes a different first voltage level. The read amplifier 3 as shown in FIG. 1 is activated at a time t3, so that the global bit line BLG assumes a different second voltage level, in the example 0 V. In case a, the transistor T1 remains in a poorly conductive state. The voltage on the global bit line BLG thus remains virtually unchanged, so that the global bit line BLG assumes the voltage level V2, due to the read amplifier 3, at the time t3. The signal PRE is activated once again at the time t4, so that the voltage level on the global bit line BLG is transferred to the bit line BL1. The read amplifier 3 is deactivated at time t5, and the signal PRE is deactivated at time t6. The global bit line BLG is then once again made to assume the output voltage of 1 V.

Figure 3:
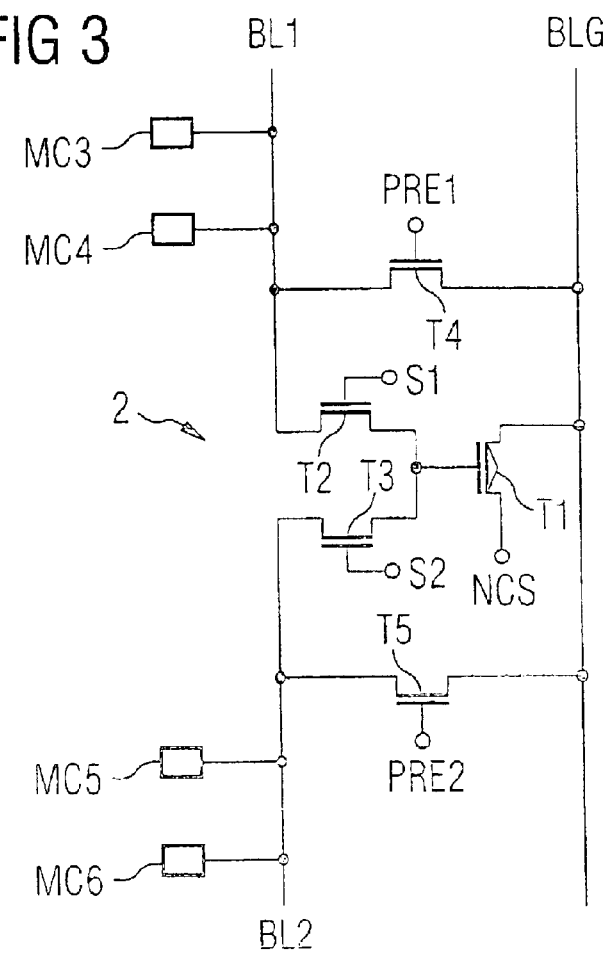
FIG. 3 is a circuit diagram of a second embodiment of a voltage amplifier.

FIG. 3 shows a second embodiment of the voltage amplifier 2 as shown in FIG. 1. Additional transistors in the form of transistors T2 and T3 are used in this case. The control connection of the main transistor T1 in FIG. 3 is connected via a switch in the form of the transistor T2 to the bit line BL1, and via a further switch in the form of the transistor T3 to a further bit line BL2. This is connected to the memory cells MC5 and MC6. Furthermore, in a similar way to the transistor T4 with the drive signal PRE1 for connecting the bit line BL1 to the global bit line BLG, a transistor T5 is provided with a drive signal PRE2, by which the bit line BL2 is connected to the global bit line BLG. The transistors T2 and T3 are driven by control signals S1 and S2. The lengths of the local bit lines BL1 and BL2 are not the same as the length of the global bit line BLG.

The voltage amplifier 2 is thus provided for a number of different bit lines BL1 and BL2. This advantageously results in that there is no need to provide a main transistor, which is equivalent to the transistor T1 and drives the global bit line BLG in the same way as the transistor T1, and which would therefore have to occupy a larger chip area than the two additionally provided transistors T2 and T3.

Figure 6:
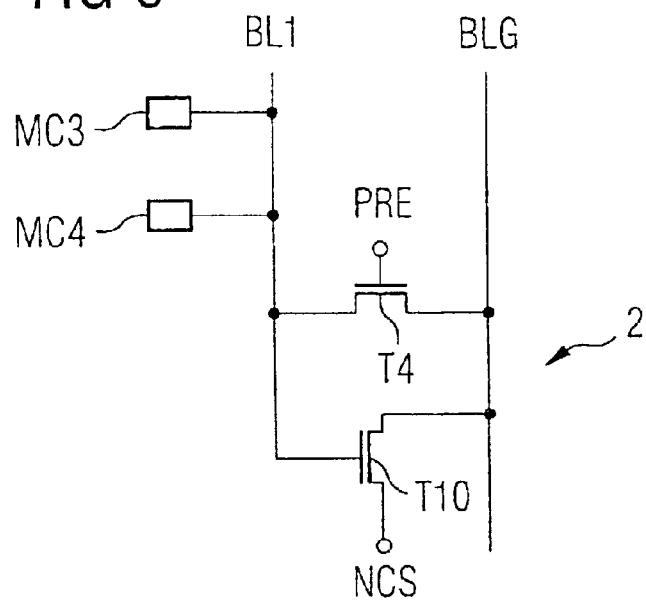
FIG. 6 is a circuit diagram of a third embodiment of a voltage amplifier.

FIG. 6 shows a further simple embodiment of the voltage amplifier 2 shown in FIG. 1. The voltage amplifier 2 has a switch in the form of an NMOS transistor T10, whose controlled path is connected between the global bit line BLG and the connection for the activation signal NCS. Otherwise, the basic circuitry is as shown in FIG. 2. In contrast to the provision of a PMOS transistor, the provision of an NMOS transistor has advantages in terms of dimensioning, switching response and the power consumption of the transistor.

Figure 7:
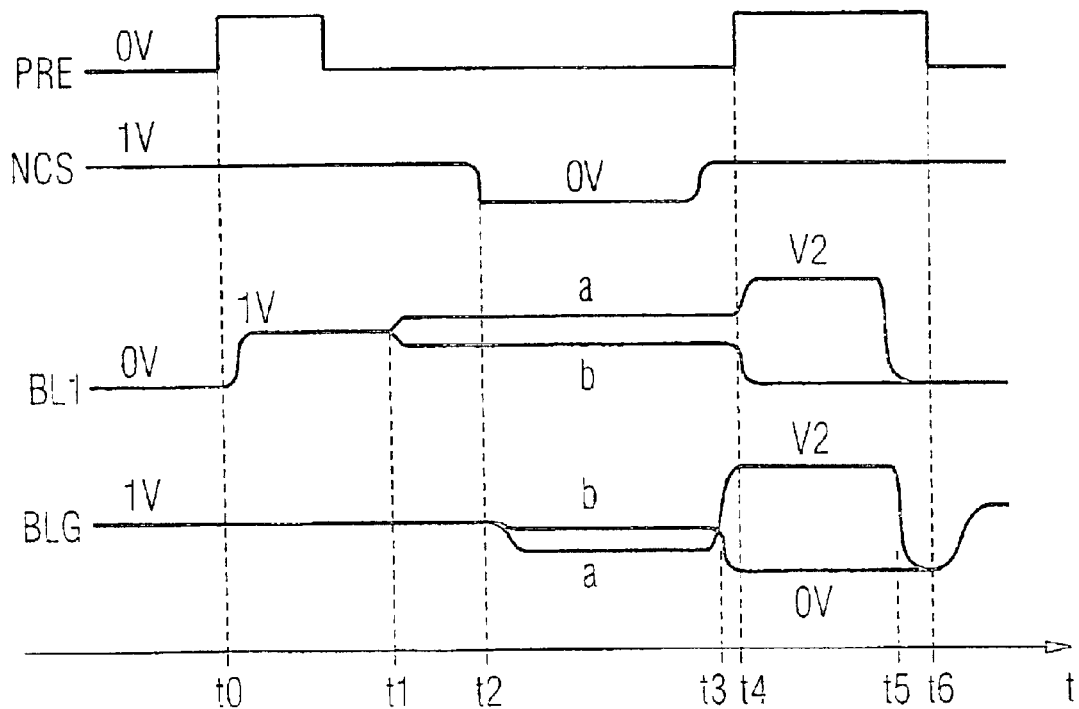
FIG. 7 is a timing-diagram of the signals for an example of a process of reading from the dynamic memory.

FIG. 7 shows a signal profile for a reading-out process when using the circuit as shown in FIG. 6. The signal PRE is once again activated at the time t0. The bit line BL1 and the global bit line BLG assume a voltage level of, for example, 1 V. The memory cell MC4 is read from at the time t1, and this leads to a voltage change on the bit line BL1. The signal NCS is activated at the time t2. The transistor T10 is switched to conduct at a different level depending on the voltage level on the bit line BL1. Here, in case a, the transistor T10 is switched to conduct to a greater extent, so that the global bit line BLG assumes a different first voltage level. The read amplifier 3, which in this case amplifies with inversion, as shown in FIG. 1 is activated at the time t3, so that the global bit line BLG assumes a different second inverted voltage level, in the example V2. In case b, the transistor T10 remains in a poorly conductive state. The voltage on the global bit line BLG thus remains virtually unchanged, so that the global bit line BLG in this case assumes the voltage level 0V at the time t3, due to the inverting read amplifier 3. The signal PRE is once again activated at the time t4, so that the voltage level on the global bit line BLG is transferred to the bit line BL1. The read amplifier 3 is deactivated at the time t5, and the signal PRE is deactivated at the time t6. The global bit line BLG is then once again made to assume the output voltage of 1 V.

An implementation as shown in FIG. 6 is also feasible with the provision of a non-inverting read amplifier. In an implementation such as this, the process of writing back to the memory cell that is to be read from is carried out in inverted form. The memory then requires logic, however, in order to read correctly from the memory cell which has been written back to, which logic ensures that the data signal which has been written back to the memory cell is read out in inverted form during a subsequent reading-out process.

Figure 5:
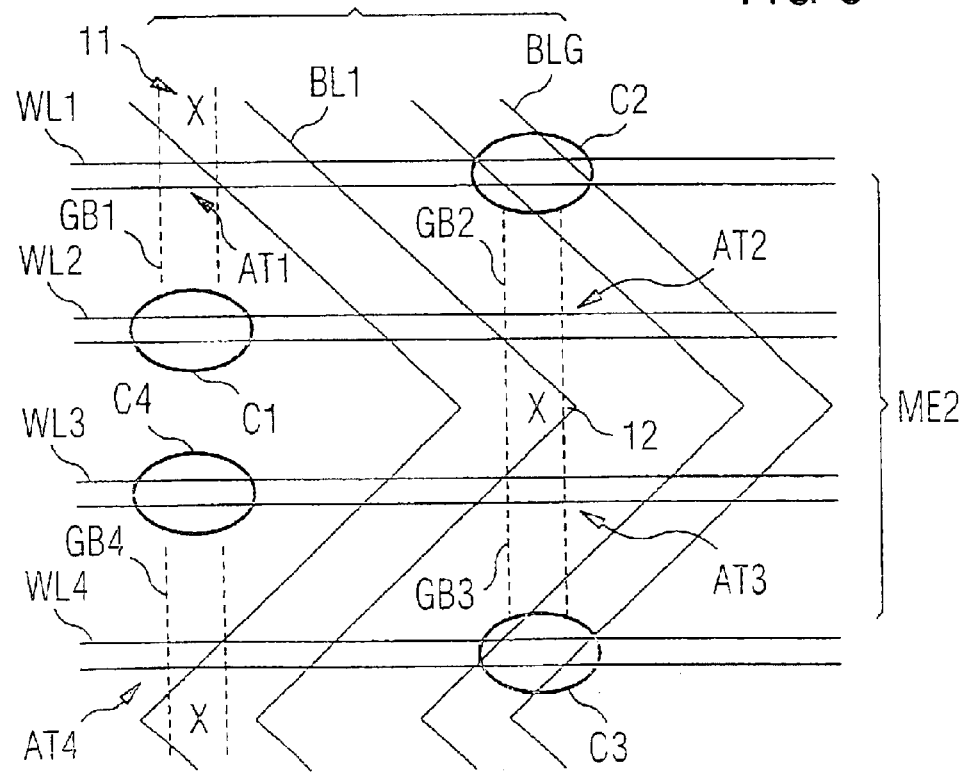
FIG. 5 is an illustration of an embodiment of a layout of the dynamic memory.

FIG. 5 shows one embodiment of a layout of the dynamic memory according to the invention, as shown in FIG. 1. The illustrated memory layout is in this case shown only roughly schematically. The memory capacitances C1 to C4, which in this case are in the form of trench capacitors, are respectively connected via active regions GB1 to GB4 of the respective selection transistors AT1 to AT4 to contacts, as shown in FIG. 1. In order to explain this by way of example, the memory capacitance C1 is connected via the active region GB1 of the selection transistor AT1 to a contact 11. The active region GB1 makes contact with the word line WL1.

The contacts 11 and 12 produce an electrical connection to the bit line BL1. The bit line BL1 is disposed such that the active regions GB1 to GB4 of the selection transistors run in parallel with, but in the opposite direction to, the bit line BL1. This configuration makes it possible to make contact with any of the memory cells MC1 to MC4, as shown in FIG. 1. In particular, the bit line BL1 runs diagonally across the orthogonal grid that is formed by the word lines WL1 to WL4 and the active regions GB1 to GB4 of the selection transistors. The bit line BL1 runs in a first direction and in a second direction, making contact with a memory cell via a contact at each direction change location. The global bit line BLG runs parallel, for example instead of a complementary bit line, to the bit line BL1 in the same metallization plane ME1. The word lines WL1 to WL4 run in a metallization plane ME2, which is disposed underneath this.

I claim:

1. An integrated dynamic memory, comprising:
   bit lines;
   word lines;
   a memory cell array having memory cells connected to said word lines for selecting said memory cells and to said bit lines for reading data signals from said memory cells;
   at least one global bit line running through said memory cell array but does not make direct contact with said memory cells;
   a voltage amplifier connected to one of said bit lines for amplification of a data signal of a respective memory cell, to be read from, to a first voltage level not sufficient for writing the data signal back to said respective memory cell read from, and said voltage amplifier further connected to said global bit line and outputs the data signal amplified to the first voltage level; and
   a read amplifier connected to said global bit line, said read amplifier amplifying the data signal from said respective memory cell read from to a second voltage level, the second voltage level being sufficient for writing the data signal back to said respective memory cell.

2. The integrated dynamic memory according to claim 1, wherein said voltage amplifier has a connection for an activation signal and a first switch with a controlled path connected between said global bit line and said connection for the activation signal, said first switch having a control connection coupled to said one of said bit lines.

3. The integrated dynamic memory according to claim 2, wherein:
   said voltage amplifier has a second switch connected to said one of said bit lines, and said control connection of said first switch is coupled through said second switch to said one of said bit lines; and
   said voltage amplifier has a third switch connected to a further one of said bit lines, said first switch is coupled through said third switch to said further one of said bit lines.

4. The integrated dynamic memory according to claim 3, wherein said voltage amplifier has a fourth switch with a controlled path, and said one of said bit lines and said global bit line are connected to each other through said controlled path of said fourth switch.

5. The integrated dynamic memory according to claim 1, wherein a number of said bit lines are each connected through said voltage amplifier to said global bit line, and said number of said bit lines and said global bit line are of different lengths.

6. The integrated dynamic memory according to claim 1, further comprising a metallization plane, and said bit lines and said global bit line are disposed in said metallization plane.

7. The integrated dynamic memory according to claim 1, wherein each of said memory cells has a selection transistor and a memory capacitance, said memory capacitance in each case being connected through said selection transistor to a respective bit line, said selection transistor in each case having a control connection connected to a respective word line, said selection transistors having active areas and said bit lines disposed such that said active areas of said selection transistors run in parallel with, but in an opposite direction to, said bit lines.

8. The integrated dynamic memory according to claim 7, wherein said word lines and said active areas of said selection transistors in said memory cells are disposed in an orthogonal grid, and said bit lines run diagonally across said orthogonal grid in a first direction and in a second direction, each of said bit lines makes contact with a respective memory cell at a point at which said respective bit line changes direction.

9. A method for operating an integrated dynamic memory, which comprises the steps of:
   making a bit line and a global bit line assume an equivalent voltage level;
   reading from a memory cell to be read from, resulting in the bit line experiencing a voltage change;
   activating a voltage amplifier so that the global bit line assumes a first voltage level; and
   subsequently activating a read amplifier so that the global bit line assumes a second voltage level.

10. The method according to claim 9, which comprises setting the bit line to assume a same voltage level as the global bit line, and the memory cell that was read from is selected for writing back a data signal.

11. The method according to claim 10, which comprises:
   writing back an inverted signal to the memory cell; and
   reading out the data signal written back once again in inverted form during a subsequent reading-out process.

12. A method for operating an integrated dynamic memory containing bit lines, word lines, a memory cell array having memory cells connected to the word lines for selecting the memory cells and to the bit lines for reading data signals from the memory cells, at least one global bit line running through the memory cell array but does not make direct contact with the memory cells, a voltage amplifier connected to a respective bit line for amplification of a data signal of a respective memory cell to be read from and connected to the global bit line; and a read amplifier connected to the global bit line, which comprises the steps of:
   making the respective bit line and the global bit line assume an equivalent voltage level;
   reading from the respective memory cell to be read from, resulting in the respective bit line experiencing a voltage change;
   activating the voltage amplifier so that the global bit line assumes a first voltage level, the first voltage level being insufficient for writing to the respective memory cell; and subsequently activating the read amplifier so that the global bit line assumes a second voltage level, the second voltage level being sufficient for writing back to the respective memory cell.

13. The method according to claim 12, which comprises setting the respective bit line to assume a same voltage level as the global bit line, and the respective memory cell that was read from is selected for writing back the data signal.

14. The method according to claim 12, which comprises:

writing back an inverted signal to the respective memory cell; and reading out the data signal written back once again in inverted form during a subsequent reading-out process.

* * * * *